United States Patent
Carper et al.

(10) Patent No.: US 11,870,139 B2
(45) Date of Patent: Jan. 9, 2024

(54) STAMPED ANTENNA MOLDING TECHNIQUE

(71) Applicant: GM Global Technology Operations LLC, Detroit, MI (US)

(72) Inventors: Duane S. Carper, Davison, MI (US); Gregg R. Kittinger, Oakland Township, MI (US); Zachary Robert Plotzke, Washington, MI (US); Nahel Eshaq, Rochester, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 89 days.

(21) Appl. No.: 17/583,543

(22) Filed: Jan. 25, 2022

(65) Prior Publication Data

US 2023/0238690 A1 Jul. 27, 2023

(51) Int. Cl.
| | |
|---|---|
| *H01Q 1/32* | (2006.01) |
| *H05K 1/18* | (2006.01) |
| *H01Q 1/08* | (2006.01) |
| *H01Q 1/42* | (2006.01) |
| *H01Q 1/12* | (2006.01) |

(52) U.S. Cl.
CPC .......... *H01Q 1/3275* (2013.01); *H01Q 1/088* (2013.01); *H01Q 1/1214* (2013.01); *H01Q 1/42* (2013.01); *H05K 1/182* (2013.01)

(58) Field of Classification Search
CPC .... H01Q 1/088; H01Q 1/1214; H01Q 1/3275; H01Q 1/42; H05K 1/182
See application file for complete search history.

(56) References Cited

U.S. PATENT DOCUMENTS

| | | | |
|---|---|---|---|
| 2007/0097002 A1* | 5/2007 | Wang | H01Q 1/3275 343/715 |
| 2010/0255688 A1* | 10/2010 | Steinkamp | H01R 24/50 439/63 |
| 2015/0270603 A1* | 9/2015 | Lee | H04B 1/18 343/713 |
| 2017/0229768 A1* | 8/2017 | Gerneth | H01Q 1/12 |
| 2020/0112101 A1* | 4/2020 | Yun | H01Q 9/0421 |

FOREIGN PATENT DOCUMENTS

| | | | |
|---|---|---|---|
| DE | 102016224926 A1 | * | 9/2017 |
| KR | 20080045024 A | * | 5/2008 |

* cited by examiner

*Primary Examiner* — Ab Salam Alkassim, Jr.
*Assistant Examiner* — Leah Rosenberg
(74) *Attorney, Agent, or Firm* — CANTOR COLBURN LLP

(57) ABSTRACT

A vehicle, an antenna assembly of the vehicle, and a method of assembling the antenna is disclosed. The vehicle includes a housing having a passage formed therethrough. A circuit board is disposed within the housing. An antenna element is coupled to the circuit board and passes through the passage. A plug fills an annular volume of the passage between the antenna element and the housing.

20 Claims, 4 Drawing Sheets

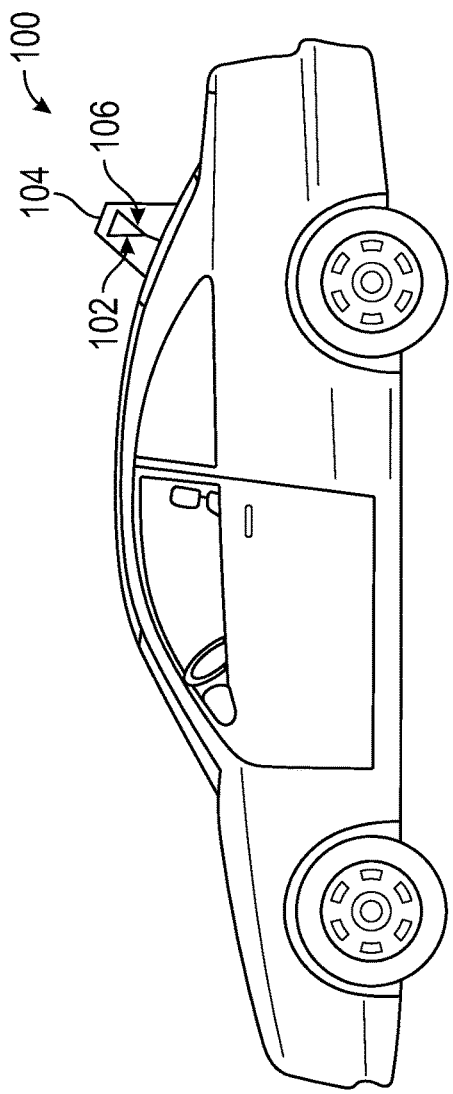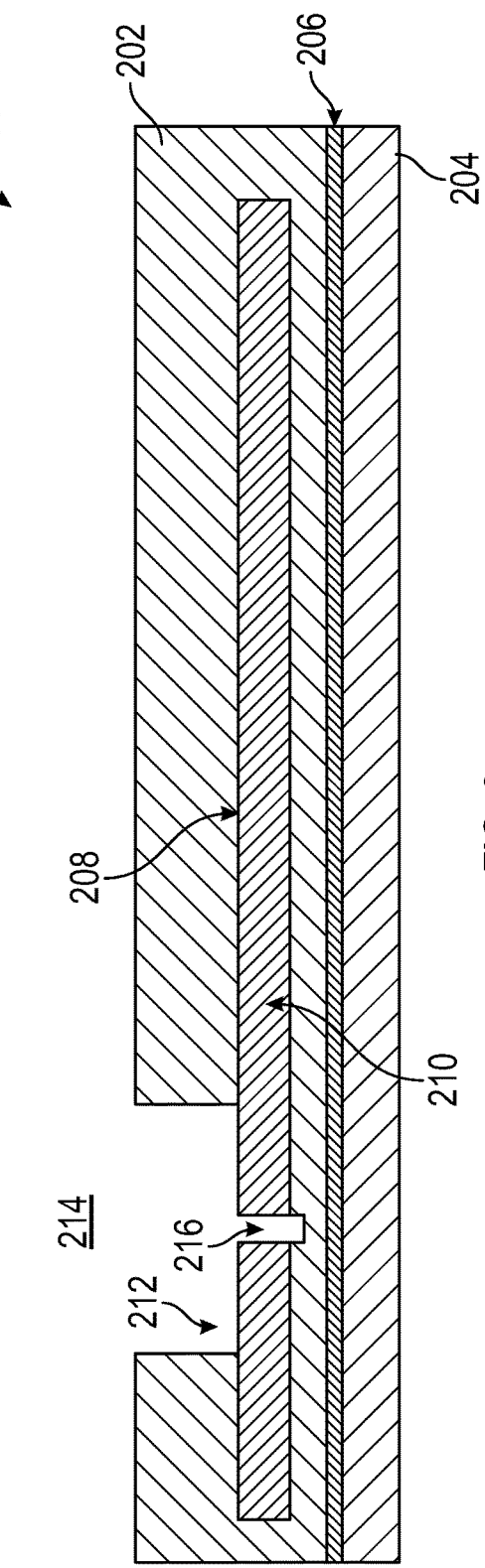

STAMPED ANTENNA MOLDING TECHNIQUE

INTRODUCTION

The subject disclosure relates to antenna design for automotive vehicles and, in particular, to an antenna element and method for attaching the antenna element to an antenna circuit board of the vehicle that protects the circuit board from outside elements.

Automotive vehicles typically include antennas for communicating electromagnetic signals. In order to seal/protect the antenna from any external environmental factors, a plastic cover conforming to the shape of the antenna is often shrink-wrapped over the antenna. Since an antenna can have its own unique design, which can be an intricate design in some cases, shrink-wrapping can be an expensive procedure. Accordingly, it is desirable to provide a cost-effective antenna assembly which can support multiple antennae designs while maintaining a suitable protection against the environment.

SUMMARY

In one exemplary embodiment, a method of assembling an antenna is disclosed. A circuit board is disposed within a housing, the housing having a passage formed therethrough. An antenna element is coupled to the circuit board by passing the antenna element through the passage, the antenna element including a plug. An annular volume between the antenna element and the passage is filled with the plug.

In addition to one or more of the features described herein, the plug further including an O-ring, the method further includes filling a gap between the plug and a wall of the passage with the O-ring. Wherein the antenna element includes a connector and the plug is coupled to a portion of the antenna element proximate the connector, the method further includes filling the passage with the plug when the connector is fit into a receptacle of the circuit board. The method further includes soldering the connector into the receptacle. The method further includes placing a cover over the housing to form a keep out zone for the antenna element. The method further includes forming the antenna element using a stamping process. The method further includes sealing the circuit board from an outside environment via the plug in the passage.

In another exemplary embodiment, an antenna assembly is disclosed. The antenna assembly includes a circuit board, and antenna element and a plug. The circuit board is disposed within a housing having a passage formed therethrough. The antenna element is coupled to the circuit board and passes through the passage. The plug fills an annular volume of the passage between the antenna element and the housing.

In addition to one or more of the features described herein, the antenna assembly further includes an O-ring for filling a gap between the plug and a wall of the passage. The antenna element includes a connector and the plug is coupled to a portion of the antenna element proximate the connector, and the plug fills the passage when the connector is fit into a receptacle of the circuit board. In an embodiment, the connector is soldered into the receptacle. The antenna assembly further includes a cover that forms a keep out zone for a communication end of the antenna element. In an embodiment, the antenna element is a stamped element. The plug seals the circuit board within the housing from an outside environment.

In yet another exemplary embodiment, a vehicle is disclosed. The vehicle includes a housing having a passage formed therethrough and a circuit board disposed within the housing. An antenna element is coupled to the circuit board and passes through the passage. A plug fills an annular volume of the passage between the antenna element and the housing.

In addition to one or more of the features described herein, the plug further includes an O-ring for filling a gap between the plug and a wall of the passage. The antenna element includes a connector and the plug is coupled to a portion of the antenna element proximate the connector, and the plug fills the passage when the connector is fit into a receptacle of the circuit board. The vehicle further includes a cover that forms a keep out zone for a communication end of the antenna element. In an embodiment, the antenna element is a stamped element. The plug seals the circuit board within the housing from an outside environment.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 1 is a vehicle with an integrated antenna element;

FIG. 2 is a side-view of a housing that supports the antenna element of FIG. 1;

DETAILED DESCRIPTION

Figure 3:
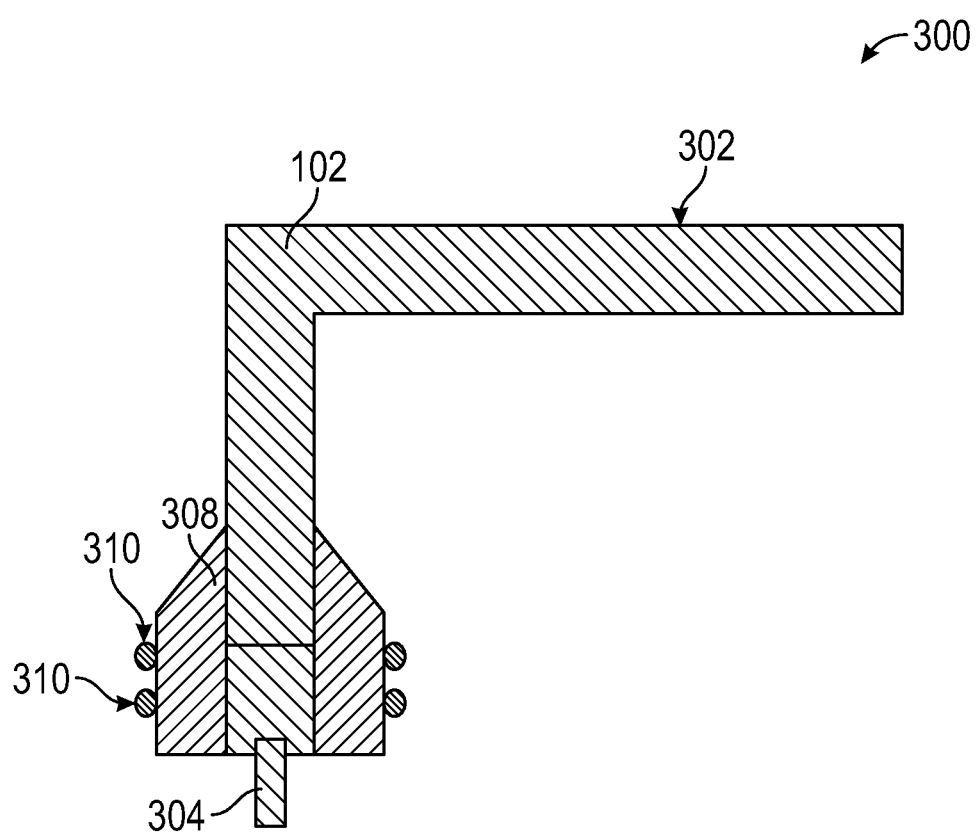
FIG. 3 is a side view of the antenna element of FIG. 1.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a vehicle 100. The vehicle 100 includes an antenna element 102. A cover 104 is attached to an outside surface of the vehicle 100 to surround the antenna element 102. The cover 104 and the outer surface of the vehicle 100 form a keep-out zone 106 within which the antenna element 102 resides and that protects the antenna element from the environment. The volume of the keep-out zone 106 is large enough to accommodate the antenna element 102. In general, the geometry of the keep-out zone 106 does not conform to the geometry of the antenna element 102.

FIG. 2 shows a side-view of a housing 200 that supports the antenna element 102 of FIG. 1 at the vehicle 100. The housing 200 can be an attachment to the vehicle 100 or can be an integrated element of the vehicle. The housing 200 includes an upper housing member 202 and a lower housing member 204. An O-ring seal 206 can be used to join the upper housing member 202 to the lower housing member 204 to form an environmentally protected seal. In various embodiments, the upper housing 202 and the lower housing 204 can be made of plastic. The upper housing 202 forms a cavity 208 therein for housing a circuit board 210. A passage 212 through the upper housing 202 exposes the cavity 208 and circuit board 210 to an outside environment 214.

The circuit board 210 is disposed within the cavity 208 of the upper housing 202. The circuit board 210 includes circuitry for communication, via the antenna element 102, signals such as by receiving a radio frequency signal, a Global Positioning Satellite signal, etc. The circuit board 210 includes a mounting slot 216 for the antenna element 102. The receptacle 216 lines up with the passage 212 when the circuit board 210 is disposed in the cavity 208.

FIG. 3 shows a side view 300 of the antenna element 102 of FIG. 1. The antenna element 102 is generally a metal element which can be a stamped element or formed using a stamping process. The antenna element 102 includes a communication portion 302 and a connector 304. The connector 304 is designed to fit into the mounting slot 216 of the circuit board 210. The mounting slot 216 and the connector 304 are designed with similarly geometries so that the connector is able to lock or fit into a secure and stable position within the mounting slot. The connector 304 can be soldered into place within the mounting slot 216. Two different antenna elements can have different designs for their communication portions while still having the same design or geometry for their connectors. Therefore, a first antenna element having a communication portion having a first design can be attached to the circuit board 210 as easily as a second antenna element having a communication portion having a second design. A plug 308 is disposed around a portion 222 of the communication portion 302 of the antenna element 102 that includes the connector 304. The plug 308 is generally an annular ring that fits around the communication portion 302 without covering the connector 304. One or more O-rings 310 can be wrapped around the plug 308.

Figure 4:
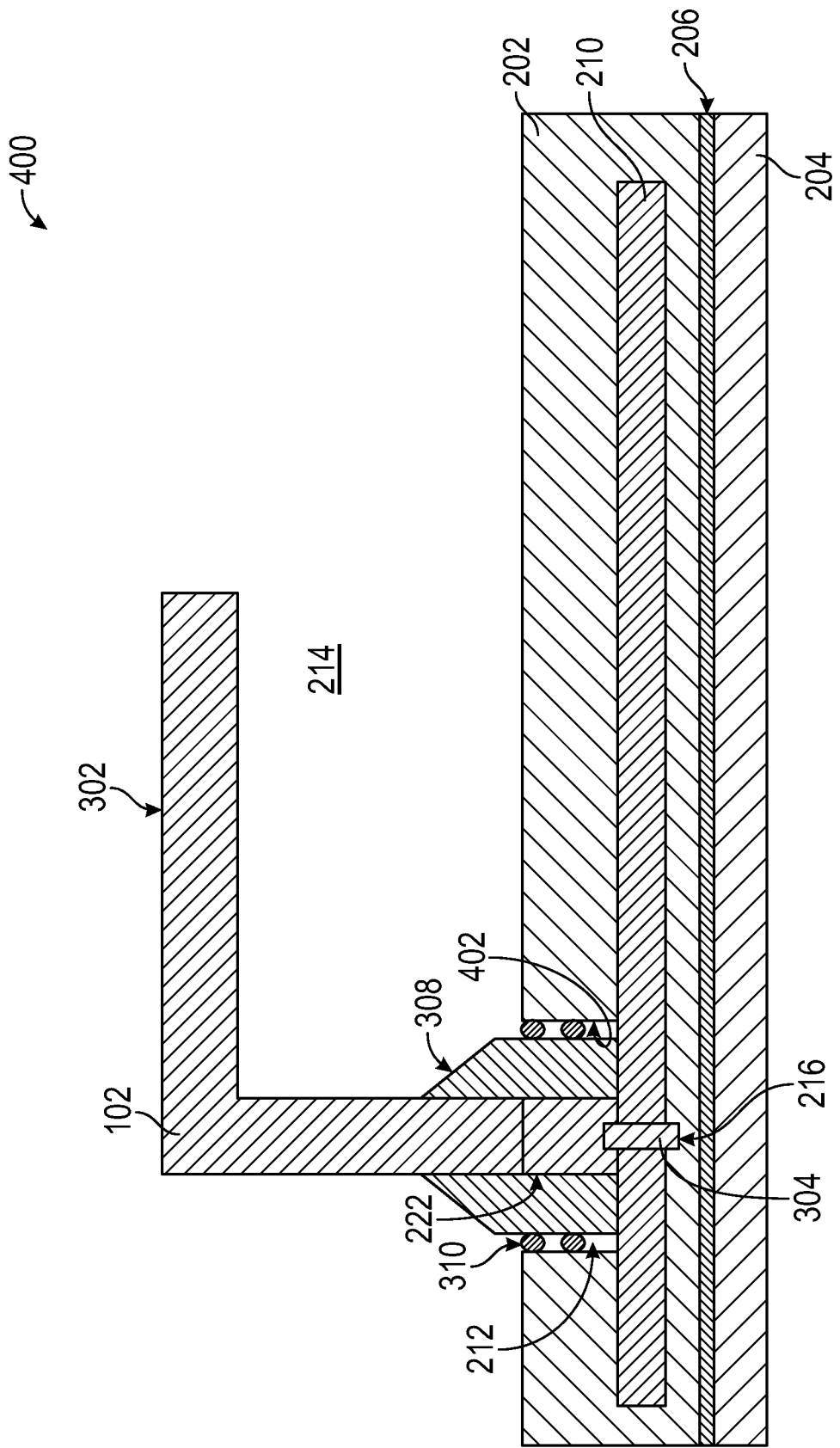
FIG. 4 shows a side view of the antenna element coupled to a circuit board of the antenna assembly to form the antenna assembly.

FIG. 4 shows a side view 400 of the antenna element 102 coupled to the circuit board 210 of the antenna assembly. The communication portion 302 of the antenna element 102 fits through the passage 212 of the upper housing 202 to allow the connector 304 to be fit into the mounting slot 216 of the circuit board 210. As the connector 304 of the antenna element is passed through the passage 212 to fit the connector 304 into the mounting slot 216, the plug 308 fills an annular volume between the antenna element 102 and an inner wall 402 of the passage 212. The one or more O-rings 310 fills any gap between the plug 308 and the inner wall 402. The plug 308 and O-rings 310 therefore seal the circuit board from the outside environment. The communication end 304 extends outside of the upper housing 202.

Figure 5:
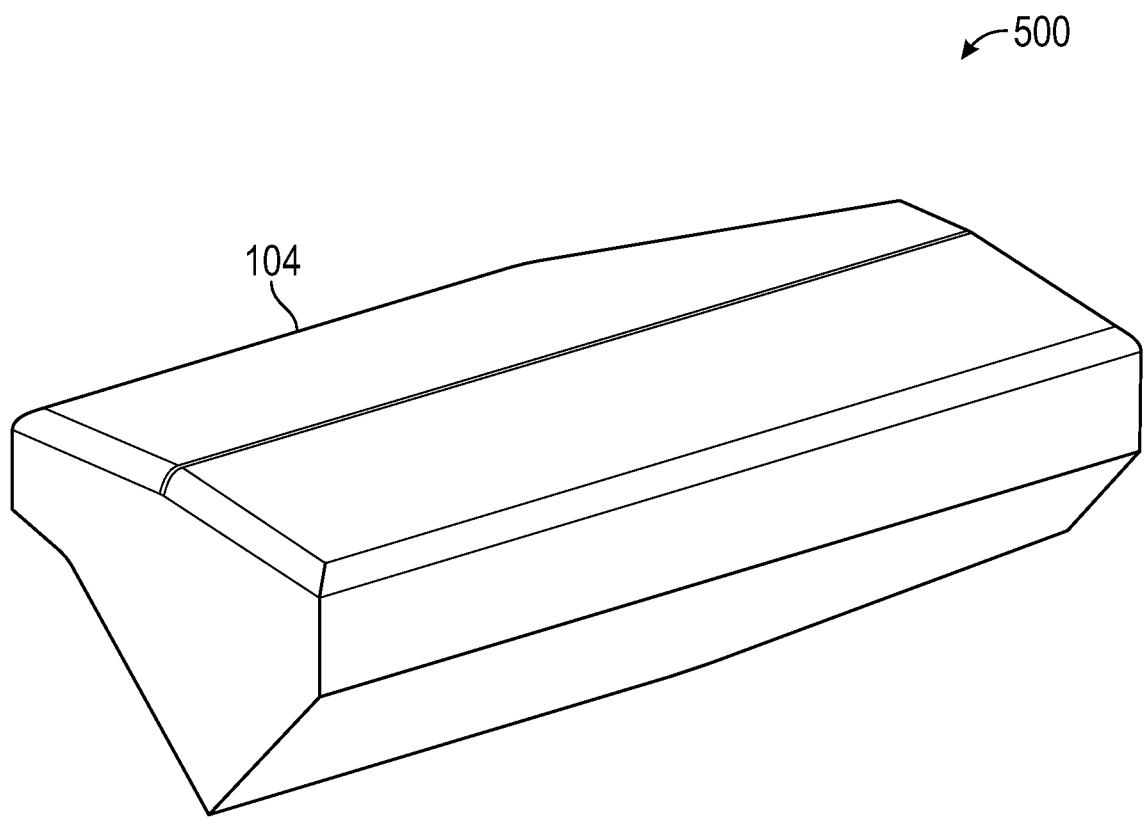
FIG. 5 shows a perspective view of a cover of the antenna assembly.

FIG. 5 shows a perspective view 500 of the cover 104 of the antenna assembly. The dimensions or contour of the cover 104 are different from, or does not conform to, the dimensions or contour of the antenna or of the communication end 304 of the antenna. Instead, the cover 104 forms a "keep-out zone" (KOZ) having a large enough volume within which the antenna can reside, regardless of the particular design of the communication end of the antenna. To switch out a first antenna for a second antenna, the cover 104 is removed from the housing or vehicle, the first antenna is detached from the circuit board, the second antenna is attached to the circuit board and the cover is then reattached to the housing or vehicle. The KOZ is able to accommodate the contours of the communication ends of both the first antenna and the second antenna.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of assembling an antenna, comprising:
disposing a circuit board within a housing, the housing having a passage formed therethrough;
coupling an antenna element to the circuit board by passing the antenna element through the passage, the antenna element including a plug in direct contact with sidewalls of a communication portion of the antenna element, the antenna element further including a connector extending directly from a bottommost end of the communication portion, the connector insertable into a mounting slot of the circuit board, wherein the antenna element and the plug are wholly removable through the passage of the housing; and
filling an annular volume between the antenna element and the passage with the plug.

2. The method of claim 1, wherein the plug further comprises an O-ring, further comprising filling a gap between the plug and a wall of the passage with the O-ring.

3. The method of claim 1, wherein the plug is coupled to a portion of the antenna element proximate the connector, further comprising filling the passage with the plug when the connector is fit into the mounting slot of the circuit board.

4. The method of claim 3, further comprising soldering the connector into the receptacle.

5. The method of claim 1, further comprising placing a cover over the housing to form a keep out zone for the antenna element.

6. The method of claim 1, further comprising forming the antenna element using a stamping process.

7. The method of claim 1, further comprising sealing the circuit board from an outside environment via the plug in the passage.

8. An antenna assembly, comprising:
a circuit board disposed within a housing, the housing having a passage formed therethrough;
an antenna element coupled to the circuit board and passing through the passage, the antenna element comprising a connector extending directly from a bottommost end of a communication portion of the antenna element, the connector insertable into a mounting slot of the circuit board; and
a plug that fills an annular volume of the passage between the antenna element and the housing, the plug in direct contact with sidewalls of the communication portion of the antenna element;
wherein the antenna element and the plug are wholly removable through the passage of the housing.

9. The antenna assembly of claim 8, further comprising an O-ring for filling a gap between the plug and a wall of the passage.

10. The antenna assembly of claim 8, wherein the plug is coupled to a portion of the antenna element proximate the connector, and wherein the plug fills the passage when the connector is fit into the mounting slot of the circuit board.

11. The antenna assembly of claim 10, wherein the connector is soldered into the receptacle.

12. The antenna assembly of claim 8, further comprising a cover that forms a keep out zone for a communication end of the antenna element.

13. The antenna assembly of claim 8, wherein the antenna element is a stamped element.

14. The antenna assembly of claim 8, wherein the plug seals the circuit board within the housing from an outside environment.

15. A vehicle, comprising:
 a housing having a passage formed therethrough;
 a circuit board disposed within the housing;
 an antenna element coupled to the circuit board and passing through the passage, the antenna element comprising a connector extending directly from a bottom-most end of a communication portion of the antenna element, the connector insertable into a mounting slot of the circuit board; and
 a plug that fills an annular volume of the passage between the antenna element and the housing, the plug in direct contact with sidewalls of the communication portion of the antenna element;
 wherein the antenna element and the plug are wholly removable through the passage of the housing.

16. The vehicle of claim 15, wherein the plug further comprises an O-ring for filling a gap between the plug and a wall of the passage.

17. The vehicle of claim 15, wherein the plug is coupled to a portion of the antenna element proximate the connector, and wherein the plug fills the passage when the connector is fit into the mounting slot of the circuit board.

18. The vehicle of claim 15, further comprising a cover that forms a keep out zone for a communication end of the antenna element.

19. The vehicle of claim 15, wherein the antenna element is a stamped element.

20. The vehicle of claim 15, wherein the plug seals the circuit board within the housing from an outside environment.

\* \* \* \* \*